United States Patent [19]
Fahrenbruch et al.

[11] Patent Number: 5,949,292
[45] Date of Patent: Sep. 7, 1999

[54] RING OSCILLATOR USING CURRENT ROBBING FOR CONTROLLING DELAY PERIOD

[75] Inventors: Shawn A. Fahrenbruch; Steven L. Dondershine; Lundy Taylor, all of Dallas, Tex.

[73] Assignee: Texas Instruments Incorporated, Dallas, Tex.

[21] Appl. No.: 08/990,484

[22] Filed: Dec. 15, 1997

[51] Int. Cl.[6] .................................................. H03B 5/02
[52] U.S. Cl. .......................... 331/57; 327/278; 327/281; 331/177 R
[58] Field of Search ................... 331/57, 177 R; 327/278, 281

[56] References Cited

U.S. PATENT DOCUMENTS 5,300,898  4/1994  Chen et al. .............................. 331/57

*Primary Examiner*—Siegfried H. Grimm
*Attorney, Agent, or Firm*—W. Daniel Swayze, Jr.; Wade James Brady, III; Richard L. Donaldson

[57] ABSTRACT

A ring oscillator includes a plurality of inverting delay elements connected in a ring. Each inverting delay element includes an inverter having an output node. The oscillator also includes a programmable current circuit operable to rob a variable amount of current from the output node of the inverter to control the duration of a delay period associated with the delay element.

19 Claims, 3 Drawing Sheets

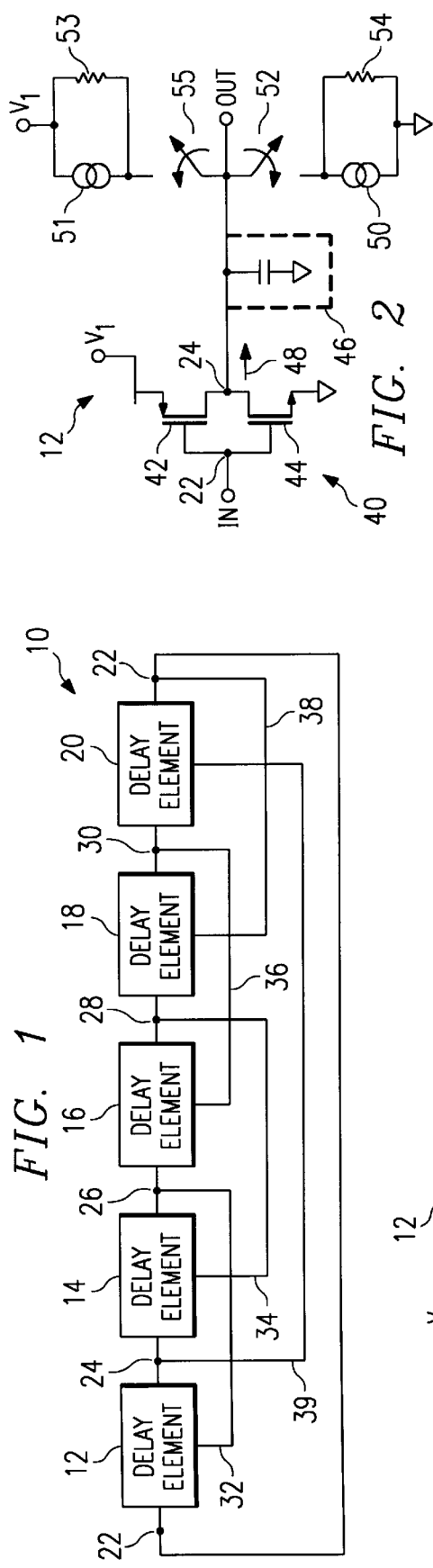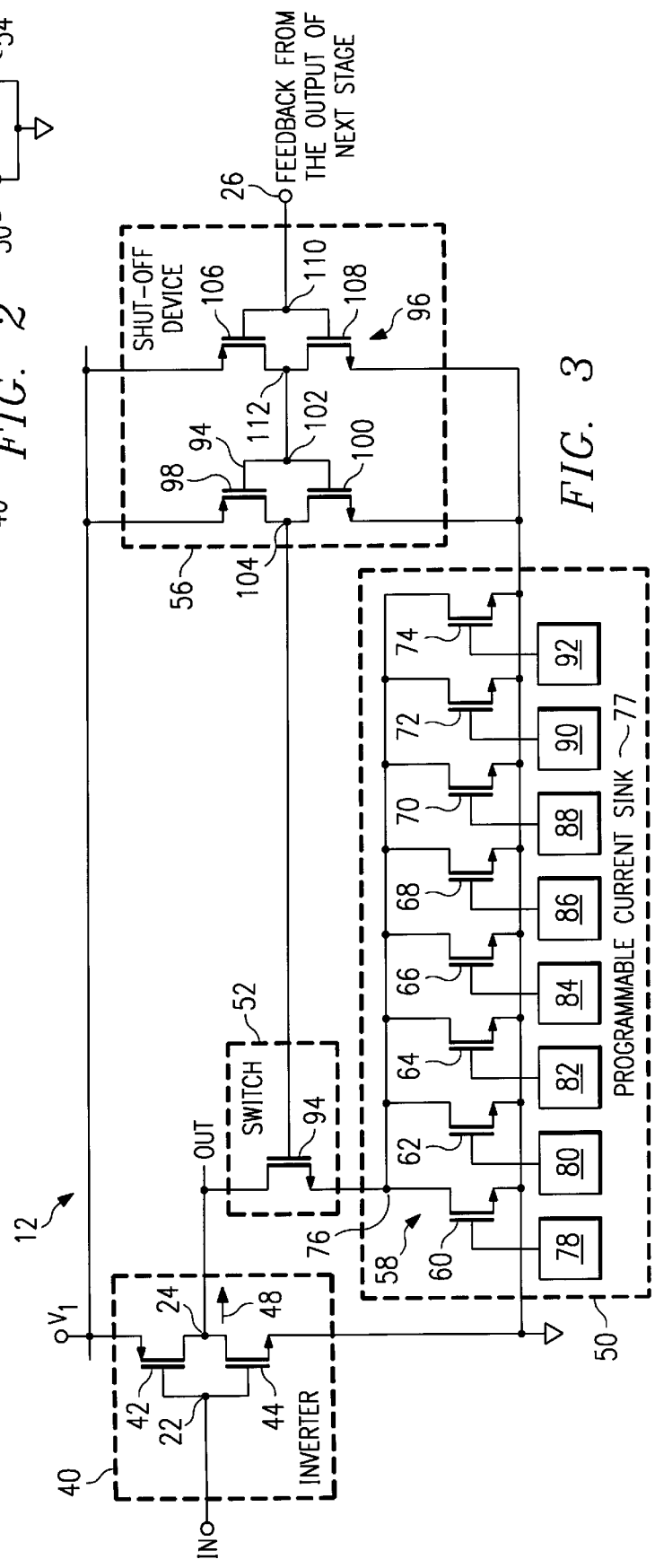

RING OSCILLATOR USING CURRENT ROBBING FOR CONTROLLING DELAY PERIOD

TECHNICAL FIELD OF THE INVENTION

This invention relates generally to ring oscillators and more particularly to a current-robbing ring oscillator and method.

BACKGROUND OF THE INVENTION

Modern electronics conventionally uses an oscillator for a variety of reasons, including producing a clock signal. One method of producing an oscillating signal includes connecting an odd number of inverting delay stages in series and providing the output of the last inverting delay stage to the input of the first inverting delay stage. Because the number of delay stages is odd, the output of such an oscillator cycles from high to low and back to high with a period equal to the delay of each delay stage multiplied by two times the number of delay stages. Thus, the frequency of such an oscillator is the reciprocal of the product of the delay of one stage and twice the number of stages.

If the above-described device produces an oscillating signal oscillating between a high value and ground, the device is referred to as a single-ended oscillator. Single-ended oscillators are desirable because they are relatively immune to substrate and thermal noise. However, they are more susceptible to power supply noise than a differential oscillator. Therefore, a single-ended oscillator is particularly desirable in digital applications.

A conventional approach to controlling the frequency of single-ended oscillators is to increase the frequency of the oscillator by increasing the drive strength of an inverter in a delay stage of the oscillator. This has been accomplished by increasing the number of inverters in parallel or by attaching a controlled amount of capacitance, through a voltage controlled resistor, to the output node of each stage. Although valid, these approaches have disadvantages. First, the silicon area required to produce such an oscillator can be tremendous. Second, the control versus range is not very linear.

SUMMARY OF THE INVENTION

Accordingly, a need has arisen for an improved oscillator and method. The present invention provides a current-robbing ring oscillator and method that addresses shortcomings of prior systems and methods.

According to one aspect of the invention, an oscillator includes a plurality of inverting delay elements connected in a ring, each inverting delay element comprising an inverter having an output node and a programmable current circuit operable to rob a variable amount of current from the output node of the inverter to control the duration of a delay period associated with the delay element.

According to another aspect of the invention, a method of delaying and inverting an electrical signal includes receiving an electrical signal having a first value at an input node of an inverter. The inverter has an output node. The method also includes charging or discharging the output node to the complement of the first value in response to receiving the electrical signal at the input node. The method further includes sinking or sourcing a variable amount of current from the output node to set the time period required to charge or discharge the output node to the complement of the first value.

The invention provides several technical advantages. For example, the invention provides an oscillator that is easy to control digitally. In addition, the invention provides an oscillator that utilizes the least amount of power at its highest frequency of operation. This is beneficial because circuits traditionally require greater power at higher frequencies. Thus, when power demand for additional circuits associated with the oscillator is highest, the power demand of the oscillator itself is lowest. In addition, the invention provides an oscillator having a control range in which the frequency of the oscillator is linear with respect to a number of set control bits. Thus, a linear control range for frequency of the oscillator may be achieved.

Other technical advantages will be readily apparent to one skilled in the art from the following figures, descriptions, and claims. The linearity of the control region may be attributed to the robbing of current from an output node of an inverter in a delay element. The amount of current robbed from the inverter is constant until a transition from a high to low voltage at an output node of the inverter is completed. In contrast, a conventional oscillator utilizes a dynamic current through an inverter, which translates into non-linear control.

BRIEF DESCRIPTION OF THE DRAWINGS

For a more complete understanding of the present invention and the advantages thereof, reference is now made to the following descriptions taken in connection with the accompanying drawings in which:

FIG. 1 is a block diagram of a current-robbing oscillator according to the teachings of the present invention;

FIG. 2 is a schematic circuit diagram showing a delay stage of the current-robbing oscillator illustrated in FIG. 1;

FIG. 3 is a schematic circuit diagram illustrating an exemplary implementation of the delay stage illustrated in FIG. 2;

DETAILED DESCRIPTION OF INVENTION

Figure 4:
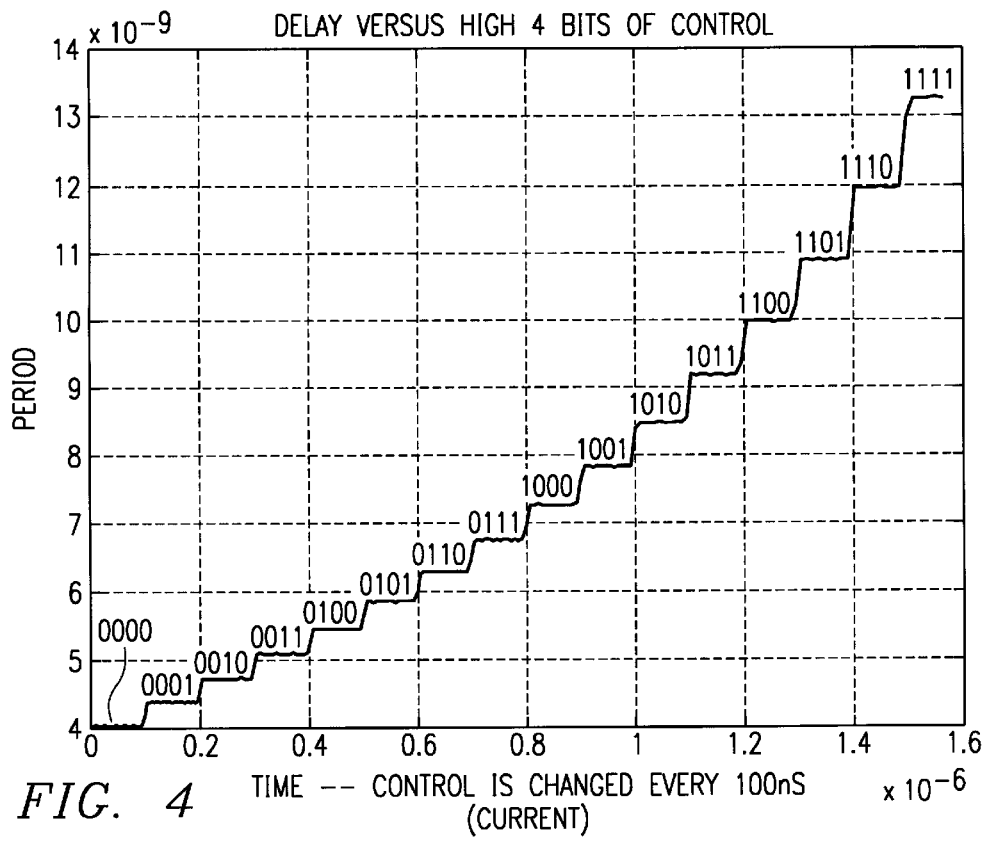
FIG. 4 is a graph illustrating delay period versus control word for the current-robbing oscillator illustrated in FIG. 1.

Embodiments of the present invention and its advantages are best understood by referring to FIGS. 1 through 6 of the drawings, like numerals being used for like and corresponding parts of the various drawings.

FIG. 1 is a block diagram of a current-robbing ring oscillator 10 according to the teachings of the present invention. Current-robbing oscillator 10 includes a plurality of inverting delay elements 12, 14, 16, 18, and 20 connected in a ring. Inverting delay elements 12, 14, 16, 18, and 20 each produce an output signal that is the complement of its input signal and that is delayed by a time period τ. In the described embodiment, inverting delay elements 12, 14, 16, 18, and 20 produce the same time delay τ.

Inverting delay element 12 has an input node 22 and an output node 24. Inverting delay element 14 has an input node 24, which is the output node of inverting delay element 12. Inverting delay element 14 also has an output node 26, which is also an input node for inverting delay element 16. Inverting delay element 16 has an output node 28, which is also an input node for inverting delay element 18. Inverting delay element 18 has an output node 30, which is also an input node for inverting delay element 20. Inverting delay element 20 has an output node 22, which is also the input node for inverting delay element 12.

Inverting delay element 12 also receives a feedback signal 32 from output node 26 of inverting delay element 14. Similarly, inverting delay element 14 receives feedback signal 34 from output node 28 of inverting delay element 16. Inverting delay element 16 receives a feedback signal 36 from output node 30 from inverting delay element 18, and inverting delay element 18 receives feedback signal 38 from output node 22 of inverting delay element 20. In addition, inverting delay element 20 receives a feedback signal 39 from output node 24 of inverting delay element 12.

In operation, current-robbing oscillator 10 generates an oscillating signal at nodes 22, 24, 26, 28, and 30 as follows. Input node 22 of inverting delay element is assumed to be a logic high. Inverting delay element 12 delays the logic high at input node 22 for a time period $\tau$. After a time period $\tau$, inverting delay element produces at node 24 the complement of a logic high, which is a logic low. According to one embodiment a logic low is ground. The logic low at node 24 is then delayed by inverting delay element 14 for a time period $\tau$ to produce a logic high at node 26. A logic high at node 26 is delayed for a time period $\tau$ by inverting delay element 16 to produce a logic low at node 28. The logic low at node 28 is delayed for a time period $\tau$ by inverting delay element 18 to produce a logic high at node 30. The logic high at node 30 is delayed for a time period $\tau$ to produce a logic low at node 22. Thus, node 22 transitions from a logic high to a logic low over a time period of $5\tau$. Node 22 similarly transitions from a logic low to a logic high over an additional time period $5\tau$. Therefore current-robbing oscillator 10 may produce a signal at node 22 that oscillates with a period $10\tau$.

Feedback signals 32, 34, 36, 38, and 39 may be utilized in one embodiment of the invention to provide particular advantages. The operation of feedback signals 32, 34, 36, 38, and 39 is described in conjunction with FIG. 3.

FIG. 2 is a schematic diagram of inverting delay element 12. Inverting delay element 12 includes an inverter 40. Inverter 40 includes a P-channel field effect transistor 42 and an N-channel field effect transistor 44. Both P-channel field effect transistor 42 and N-channel field effect transistor 44 include a gate, a source, and a drain. Node 22 is connected to the gates of P-channel field effect transistor 42 and N-channel field effect transistor 44. The drains of P-channel field effect transistor 42 and N-channel field effect transistor 44 are connected to node 24. The source of P-channel field effect transistor 42 is connected to a voltage source $V_1$ and the source of N-channel field effect transistor 44 is connected to ground.

In operation, inverter 40 inverts a voltage signal applied at node 22 and places the result at node 24. If a logic high is placed at node 22, transistor 42 will turn off because it is a P-channel field effect transistor and it has a zero gate-to-source voltage. A P-channel field effect transistor does not conduct if it has a zero gate-to-source voltage. Conversely, N-channel field effect transistor 44 will turn on because it is an N-channel field effect transistor and has a positive gate-to-source voltage. An N-channel field effect transistor will conduct current if it has a positive gate-to-source voltage. Therefore, after a logic high is placed at node 22, current will flow from node 24 to ground, discharging node 24 from a high voltage to a low voltage, with node 24 eventually assuming a low voltage. Thus, the voltage at node 24 is the complement of the voltage at node 22 after a delay time period $\tau$. Therefore inverter 40 acts as an inverter.

If a low voltage is applied at node 24, P-channel field effect transistor 42 turns on because it is a P-channel device and has a negative gate-to-source voltage. A P-channel field effect transistor conducts current when it has a negative gate-to-source voltage. In addition, N-channel field effect transistor 44 will turn off because it is an N-channel field effect transistor and has a zero gate-to-source voltage. A N-channel field effect transistor does not conduct current when it has a zero gate-to-source voltage. Therefore current will flow from voltage source $V_1$ to node 24 and node 24 will begin to charge from a low value to a high value, eventually assuming a voltage of approximately $V_1$.

The charging and discharging of node 24 is not instantaneous because of a parasitic capacitance of inverting delay element 12, which is represented by imaginary capacitor 46. The time required to charge node 24 is proportional to the capacitance of the imaginary capacitor 46 and inversely proportional to current 48 through node 24. Therefore, for a fixed capacitance of imaginary capacitor 46, the time to charge node 24 may be varied by varying current 48.

For example, when node 22 is low, P-channel field effect transistor 42 will begin to charge node 24. However, if switch 52 is closed and programmable current sink 50 sinks current from node 24, node 24 will charge more slowly because current is robbed from the charging node 24, therefore increasing the delay of inverting delay element 12.

Alternatively, or additionally, a current source 51 may source current to node 24 and slow the discharging of node 24, thus robbing current from node 24. Such robbing of current increases the delay of inverting and delay element 12 during periods when the voltage at node 22 is high. A high impedance resistor 53 is illustrated as being in parallel with current source 51 for receiving current when a switch 55 is open. By varying the time required to charge or discharge node 24, the delay time $\tau$, of inverting delay element 12 may be adjusted. By adjusting the delay time, $\tau$, of each delay element 12, 14, 16, 18, and 20, the frequency of oscillation of a voltage at nodes 22, 24, 26, 28, and 30 of current-robbing oscillator may be varied. Thus, the frequency of oscillation of nodes 22, 24, 26, 28, and 30 of current-robbing oscillator 10 may be varied by varying the amount of current, such as current 48, robbed from an output node, such as node 24, of each delay element.

According to the teachings of the present invention a current sink 50 modifies current 48 through output node 24 by sinking, or robbing, current from node 24. Current sink 50 is illustrated as being in parallel with a large impedance resistor 54. According to one embodiment of the invention, current is robbed from node 24 by current sink 50 only when the voltage at node 24 is low. One method for robbing current only when the output at node 24 is low is accomplished by providing a switch 52. Switch 52 is closed, corresponding to an "on" condition, when the voltage at node 24 is charging from low to high. Conversely, switch 52 is open, or "off," when the voltage at node 24 is discharging from high to low. If switch 52 is open, current sink 50 sinks current across high impedance resistor 54. If switch 52 is closed, or "on," current sink 50 sinks current from node 24, robbing current from node 24, and therefore reducing the amount of current which charges capacitor 46. Switch 55 may similarly control robbing of current from node 24 by current source 51 when node 24 is discharging.

As described above, the time to charge parasitic capacitance, or the capacitance of imaginary capacitor 46, is inversely proportional to the amount of current flowing through node 24. Therefore by reducing the amount of current through node 24, the time required to discharge node 24 from a high value to a low value is increased. Thus the delay period, τ, of inverting delay element 12 may also be modified. The amount of current sunk through current sink 50 or sourced by current source 51 may therefore be modified to produce a tuneable delay for inverting delay element 12.

FIG. 3 illustrates an exemplary implementation of inverting delay element 12. Inverting delay elements 14, 16, 18, and 20 may be similarly constructed. Inverting delay element 12 includes inverter 40, programmable current sink 50, switch 52, and a shut off device 56. Inverter 40 is as described above in conjunction with FIG. 2. Programmable current sink 50 comprises a plurality 58 of N-channel field effect transistors. Plurality 58 of N-channel field effect transistors includes field effect transistors 60, 62, 64, 66, 68, 70, 72, and 74. Plurality 58 of field effect transistors have sources connected to ground and drains connected a node 76. The gates of plurality 58 of transistors are connected to a plurality 77 of control nodes. Plurality 77 of control nodes includes control nodes 78, 80, 82, 84, 86, 88, 90, and 92. A transistor 94 serves as a switch 52 to selectively connect node 24 with node 76. Transistor 94 is an N-channel field effect transistor. The gate of transistor 94 is connected to shut-off device 56. In the implementation of inverting delay element 12 illustrated in FIG. 3, a current source such as current source 51 is not utilized. Therefore, only charging of node 24 is delayed by robbing current from node 24. However, other embodiments of the invention could utilize a current source such as current source 51. Therefore, the delay period τ of each inverting delay element 12, 14, 16, 18, and 20 will differ somewhat for transitions from low to high than for transitions from high to low.

Shut-off device 56 includes a pair of inverters 94 and 96. Inverter 94 includes a P-channel field effect transistor 98 and an N-channel field effect transistor 100. The gates of P-channel field effect transistor 98 and N-channel field effect transistor are connected to a node 102. The drains of field effect transistors 98 and 100 are connected to an output node 104, which is connected to the gate of transistor 94 in switch 52. Therefore, the voltage at output node 104 of shut-off device 56 controls switch 52.

Inverter 96 includes a P-channel field effect transistor 106 and an N-channel field effect transistor 108. The gates of P-channel field effect transistor 106 and N-channel field effect transistor 108 are connected to a node 110, which is connected to output node 26 of inverting delay element 14. Therefore, node 110 receives feedback signal 32 having the voltage at the output of the next inverting delay element, which in this example is inverting delay element 14. The drains of P-channel field effect transistor 106 and N-channel field effect transistor 108 are connected to node 112, which is connected to node 102.

In operation, shut-off device 56 receives feedback signal 32 at node 110 from output node 26 of inverting delay element 14. Inverter 96 inverts the voltage at 110 and provides an output voltage at node 112, which is provided as an input voltage at node 102 to inverter 94. Inverter 94 inverts the voltage at node 102 to produce a voltage at node 104 that is the same as the voltage at node 26. The voltage at node 104 is provided to the gate of transistor 94 and therefore controls the status of switch 52. Because transistor 94 in switch 52 is an N-channel field effect transistor, a positive gate-to-source voltage of transistor 94 turns switch 52 on and a negative gate-to-source voltage turns switch 52 off. Thus, when the voltage at node 104 is high, switch 52 is on, and when the voltage at node 104 is low, switch 52 is off. The provision of switch 52 and shut-off device 56 results in power savings because current is only sunk when the voltage at output node 24 is charging. Shut off device 56 includes inverters 94 and 96 rather than directly connecting the gate of transistor 94 to node 26 because of two reasons. The first is that inverter 96 may be a low strength inverter. Therefore inverter 96 does not provide a large load to the next stage. The second reason is that node 24 can completely transition before switch 52 is activated or deactivated.

In operation, each transistor of the plurality of transistors 58 in programmable current sink 50 may be turned on or off to sink current by the application of an appropriate voltage at each of the plurality of control nodes 77. Because plurality 58 of field effect transistors are N-channel devices, a positive gate-to-source voltage applied to the gate of the transistors turns the transistors on. Thus, a maximum current may be sunk by programmable current sink 50 by applying a high voltage to each of the plurality of control nodes 77, and no current may be sunk by programmable current sink 50 by applying a low voltage to each of the plurality of control node 77. Varying amounts of current may be sunk by programmable current sink 50 by selectively controlling each of the plurality of control nodes 77. In one embodiment, the currents produced by transistors 60, 62, 64, 66, 68, 70, 72, and 74 are weighted such that the current produced by transistor 60 is $k2^7$, the current produced by transistor 62 is $k2^6$, the current produced by transistor 64 is $k2^5$, the current produced by transistor 66 is $k2^4$, the current produced by transistor 68 is $k2^3$, the current produced by transistor 70 is $k2^2$, the current produced by transistor 72 is $k2^1$, the current produced by transistor 74 is $k2^0$, where k is a constant. Control nodes 77 may therefore be controlled digitally by an 8 bit control word. Results of the operation of the above-described current-robbing oscillator 10 are described below in conjunction with FIGS. 4 through 6.

Figure 5:
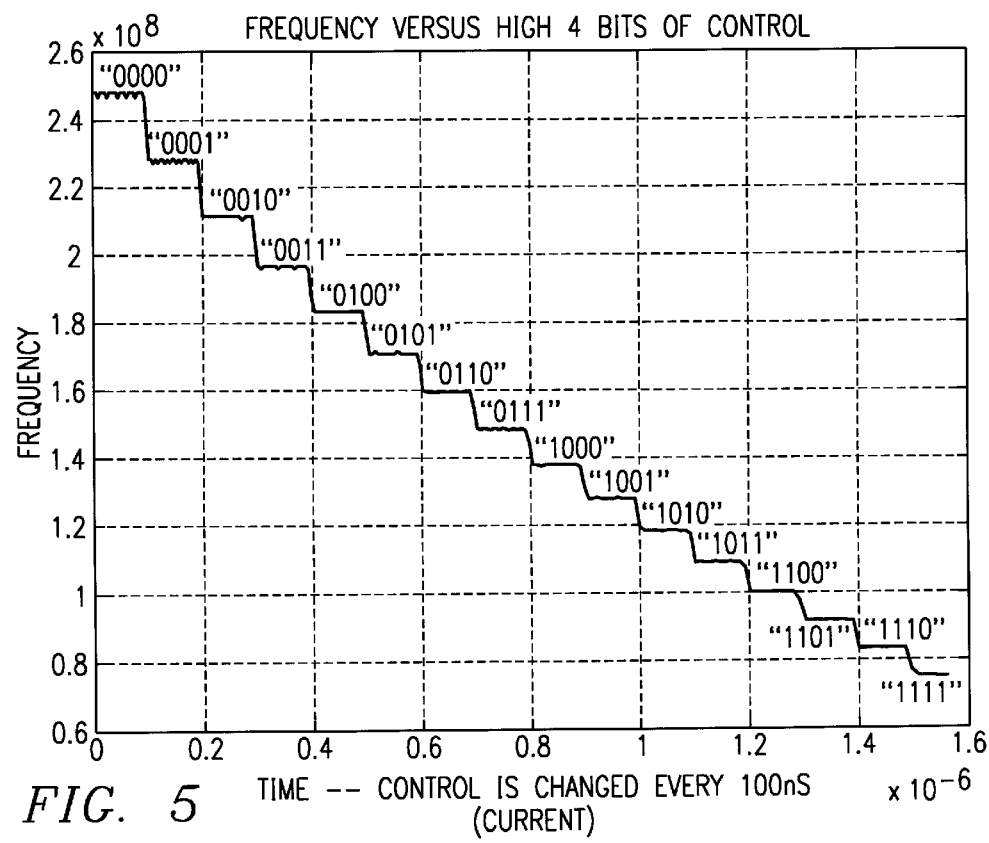
FIG. 5 is a graph illustrating frequency versus control word for the current-robbing oscillator illustrated in FIG. 1.

FIG. 4 is a graph of delay versus control word for current-robbing oscillator 10 for the four most-significant bits of the control word, which corresponds to control nodes 78, 80, 82, and 84. Each control word corresponds to a step change in current that is sunk by programmable current sink 50. The far left-hand side of FIG. 4 corresponds to no current being sunk by programmable current sink 50 and the far right-hand side of FIG. 5 corresponds to a large current being sunk by programmable current sink 50. As illustrated, the delay, or period, of current-robbing oscillator 10 is fairly linear with respect to the current sunk by programmable sink 50, as well as linear with respect to the control word. FIG. 5 illustrates a graph of frequency of current-robbing oscillator 10 with respect to the control word, which corresponds to the amount of current sunk by programmable current sink 50. The relationship between frequency of current-robbing oscillator 10 and the control word is fairly linear over the range of 60 to 260 MHz, which is desirable. The linearity of the control region may be attributed to the robbing of current from output nodes of inverters in each delay element 12, 14, 16, 18, and 20, such as node 24 in inverter 40. The amount of current robbed from the inverter 40 is constant until a transition from a high to low voltage at node 24 is completed. In contrast, a conventional oscillator utilizes a dynamic current through an inverter, which translates into non-linear control. Moreover, because inverter 40 inverting delay element 12 does not have to be cascaded with a drive strength control, oscillator 10 according to the teachings of the present invention may produce an oscillating frequency with a higher frequency than traditional oscillators.

Figure 6:
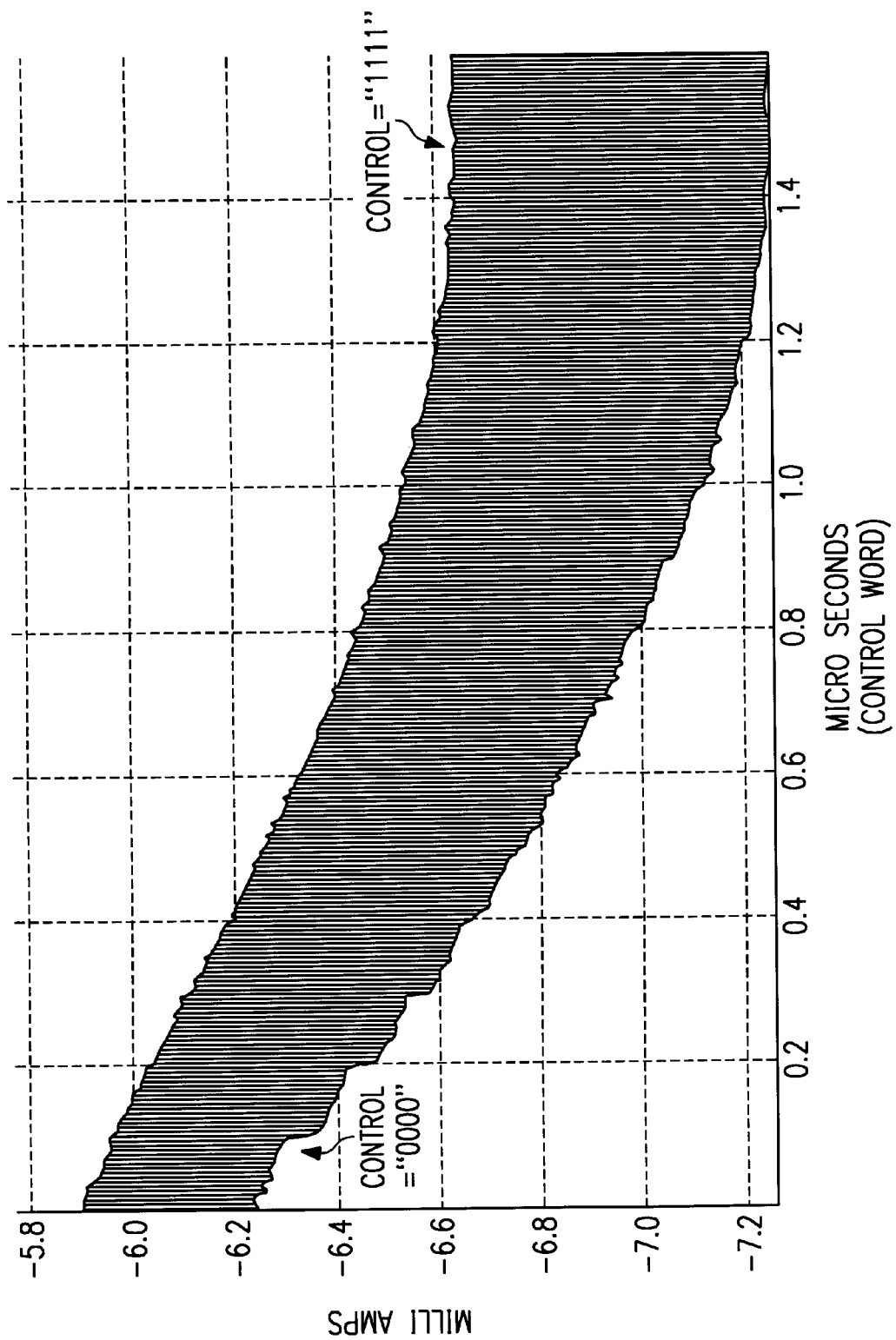
FIG. 6 is a graph illustrating current consumption versus control word for the current-robbing oscillator illustrated in FIG. 1.

FIG. 6 illustrates a graph of current consumption for current-robbing oscillator 10 versus control word for the four most-significant bits of the control word, which corresponds to the amount of current sunk by programmable current sink 50. The far left hand side of the graph in FIG. 6 corresponds to a control word of 0000, which represents no current sunk by programmable current sink 50, and the far right hand side of FIG. 6 represents a control word of 1111, which corresponds to a large current sunk by programmable current sink 50. As illustrated, the current consumption of current-robbing oscillator 10 is highest when no current is sunk by programmable current sink 50 and is lowest when the maximum amount of current is sunk by programmable current sink 50. This corresponds to a power consumption that is greatest at lower frequency for current-robbing oscillator 10 and lowest at the highest frequencies for current-robbing oscillator 10. Such a power consumption versus frequency characteristic is desirable because traditionally power consumption of circuits is greatest at higher frequencies. Therefore, the present invention produces lower overall power consumption at higher frequencies.

Although the present invention and its advantages have been described in detail, it should be understood that various changes, substitutions, and alterations can be made therein without departing from the spirit and scope of the present invention as defined by the appended claims.

What is claimed is:

1. An oscillator comprising:
   a plurality of inverting delay elements connected in a ring, each inverting delay element comprising:
   an inverter having an output node; and
   a programmable current circuit operable to rob variable amounts of current from the output node of the inverter to control the duration of a delay period associated with the delay element.

2. The oscillator of claim 1, wherein the inverter further comprises:
   a P-channel field effect transistor having a gate, a source, and a drain, the drain of the P-channel field effect transistor being connected to the output node; and
   an N-channel field effect transistor having a gate, a source, and a drain, the gate of the N-channel field effect transistor being connected the gate of the P-channel field effect transistor and the drain of the N-channel field effect transistor being connected to the output node.

3. The oscillator of claim 1, wherein the programmable current circuit is connected to the output node.

4. The oscillator of claim 1, wherein the programmable current circuit further comprises:
   a plurality of current sources; and
   a plurality of control nodes connected in a one-to-one fashion to the plurality of current sources, each of the plurality of control nodes operable to control one of the plurality of current sources.

5. The oscillator of claim 1, wherein each of the delay elements further comprises a switch operable to allow current to be robbed or prevent current from being robbed from the output node by the programmable current circuit.

6. The oscillator of claim 1, wherein the programmable current circuit further comprises a programmable current source operable to source current to the output node.

7. The oscillator of claim 5, wherein the plurality of delay elements comprises a first delay element and a second delay element, the second delay element receiving an input signal from the first delay element, the second delay element producing an output signal, the first delay element receiving the output signal from the second delay element, the output signal from the second delay element controlling whether the switch allows current to be robbed or prevents current from being robbed from the output node by the programmable current circuit.

8. The oscillator of claim 1, wherein the programmable current circuit further comprises a programmable current sink operable to sink current from the output node.

9. A variable delay inverting delay element for producing a variable delay in an input signal, the delay element comprising:
   an inverter having an input node and an output node, the output node operable to charge, over a time period, from a low value to a high voltage in response to the inverter receiving an input signal having a low value at the input node; and
   a programmable current sink operable to sink current from the output node and affect the time period required to charge the output node in response to receiving the input signal at the input node.

10. The delay element of claim 9, and further comprising a switch for selectively preventing the programmable current sink from sinking current from the output node.

11. The delay element of claim 9, wherein the programmable current sink comprises a plurality of current sinks.

12. A method of delaying and inverting an electrical signal, the method comprising the steps of:
    receiving an electrical signal having a first value at an input node of an inverter, the inverter having an output node;
    transitioning the output node to the complement of the first value in response to receiving the electrical signal at the input node, the transitioning occurring over a time period; and
    robbing a variable amount of current from the output node to set the time period required to transition the output node to the complement of the first value.

13. The method of claim 12, wherein the step of robbing a variable amount of current comprises providing a programmable current sink operable to sink current from the output node.

14. The method of claim 12, wherein the step of robbing a variable amount of current comprises providing a programmable current source operable to source current to the output node.

15. The method of claim 13, and further comprising providing control signals to the programmable current sink, the control signals operable to vary the amount of current sunk by the programmable current sink.

16. The method of claim 12, wherein the step of receiving an electrical signal having a first value at an input node comprises receiving the electrical signal at the gate of a first transistor and at the gate of a second transistor.

17. The method of claim 12, wherein the step of robbing a variable amount of current comprises providing a programmable current sink and a programmable current source, the programmable current sink operable to sink current from the output node when the output node is charging and the programmable current source operable to source current to the output node when the output node is discharging.

18. The method of claim 12, wherein the step of robbing current further comprises providing a programmable current sink and a switch, the switch allowing the programmable current sink to sink current when the output node is charging.

19. The method of claim 12, wherein the step of robbing current further comprises providing a programmable current source and a switch, the switch allowing the programmable current source to source current when the output node is discharging.

* * * * *